United States Patent [19]
Farnworth et al.

[11] Patent Number: 5,726,075
[45] Date of Patent: Mar. 10, 1998

[54] METHOD FOR FABRICATING MICROBUMP INTERCONNECT FOR BARE SEMICONDUCTOR DICE

[75] Inventors: Warren M. Farnworth, Nampa; David R. Hembree; Derek Gochnour, both of Boise, all of Id.

[73] Assignee: Micron Technology, Inc., Boise, Id.

[21] Appl. No.: 624,991

[22] Filed: Mar. 29, 1996

[51] Int. Cl.$^6$ .................................................. H01L 21/28
[52] U.S. Cl. ........................... 438/18; 438/613; 438/614; 438/686; 204/123
[58] Field of Search ........................... 438/18, 675, 108, 438/686, 612, 614, 613; 257/737, 738, 779; 324/755, 765; 205/123, 188

[56] References Cited

U.S. PATENT DOCUMENTS

| | | | |
|---|---|---|---|
| 5,072,289 | 12/1991 | Sugimoto et al. | 357/68 |
| 5,090,118 | 2/1992 | Kwon et al. | 29/843 |
| 5,123,850 | 6/1992 | Elder et al. | 439/67 |
| 5,225,037 | 7/1993 | Elder et al. | 156/644 |
| 5,262,718 | 11/1993 | Svendsen et al. | 324/158 P |
| 5,289,631 | 3/1994 | Koopman et al. | 29/840 |
| 5,302,891 | 4/1994 | Wood et al. | 324/158 F |
| 5,367,253 | 11/1994 | Wood et al. | 324/158.1 |
| 5,408,190 | 4/1995 | Wood et al. | 324/765 |
| 5,438,223 | 8/1995 | Higashi et al. | 257/774 |
| 5,440,240 | 8/1995 | Wood et al. | 324/765 |
| 5,487,999 | 1/1996 | Farnworth | 437/7 |

OTHER PUBLICATIONS

Yamamoto, Yasuhikio et al., "Evaluation of New Micro-Connection System Using Microbumps", Nitto Denko Corp., Technical Paper, ISHM '93 Proceedings, pp. 370–378, 1995.

Miyake, Koyoshi et al., "Connectivity Analysis of New 'Known Good Die' Connection System Using Microbumps", Technical Report, Nitto Denko Corp., pp. 1–7, 1994.

"Science Over Art. Our New IC Membrane Test Probe," Packard Hughes Interconnect Advertising Brochure, 1993.

*Primary Examiner*—John Niebling
*Assistant Examiner*—Thomas G. Bilodeau
*Attorney, Agent, or Firm*—Stephen A. Gratton

[57] ABSTRACT

A method for forming an interconnect for a bare semiconductor is provided. The interconnect includes an insulating film with a pattern of conductors and microbumps adapted to make an electrical connection with contact locations on the die. The insulating film and conductors are mounted to a rigid substrate (e.g., silicon) using an lo elastomeric adhesive. The method includes forming conductive bus bars in electrical communication with the pattern of conductors to provide an electrical path for electroplating the microbumps onto the conductors. Following the electroplating step, the bus bars are severed and separate electrical paths are formed to the conductors. The bus bar can also be used in the completed interconnect to provide a common electrical path to select conductors. The interconnect can be used for testing the die or for providing a permanent electrical connection to the die.

36 Claims, 4 Drawing Sheets

METHOD FOR FABRICATING MICROBUMP INTERCONNECT FOR BARE SEMICONDUCTOR DICE

FIELD OF THE INVENTION

This invention relates generally to semiconductor manufacture and specifically to a method for fabricating a microbump interconnect for a bare semiconductor die.

BACKGROUND OF THE INVENTION

In the manufacture of unpackaged semiconductor dice it is sometimes necessary to make an electrical connection with contact locals on the dice (e.g., bond pads) for testing or other purposes. For example, burn-in and full functionality tests are used to certify each unpackaged die as a known good die (KGD). During the test procedures, test apparatus for single bare dice (also referred to as carriers) take the place of conventional plastic or ceramic semiconductor packages. Exemplary test apparatus are disclosed in U.S. Pat. Nos. 5,302,891; 5,408,190 and 5,495,179 to Wood et al.

This type of test apparatus typically includes an interconnect component for making the temporary electrical connection between the die and test apparatus. For example, U.S. Pat. No. 5,483,741 to Akram et al. discloses an interconnect formed on a silicon substrate with integrally formed silicon contact members.

Another type of interconnect for these test apparatus is formed with microbump contact members. For example, U.S. Pat. No. 5,487,999 to Farnworth discloses an interconnect for bare dice that includes microbump contact members. The microbump contact members comprise metal bumps formed on conductors attached to an insulative film such as polyimide. The microbumps are adapted to make electrical contact with the contact locations on the die. The conductors are adapted to establish a circuit path to the microbumps. For forming an interconnect, the insulative film with the microbumps and conductors thereon, can be mounted to a rigid substrate.

With this type of microbump interconnect, the manufacturing process for the microbumps is complicated by the size and spacing required for the microbumps. In particular, the microbumps are formed in a pattern that is a mirror image of the corresponding contact locations on the die. These contact locations are typically the bond pads of the die. With advances in semiconductor manufacture, the number of bond pads on semiconductor dice has increased. At the same time, the size and spacing of the bond pads has decreased. Typical bond pads now have a size and spacing of only about 50 µm. The microbumps and conductors on interconnects for semiconductor dice must have a corresponding geometry. This geometry can be difficult to accomplish using current fabrication processes for microbump interconnects.

The present invention is directed to an improved method for forming microbump interconnects with a large number of closely spaced microbumps and with a minimum number of process steps. Accordingly, it is an object of the present invention to provide an improved method for forming microbump interconnects for bare semiconductor dice.

It is another object of the invention to provide an improved method for forming microbump interconnects having microbumps and conductors formed in tightly spaced geometrical patterns.

It is a further object of the present invention to provide an improved method for forming microbump interconnects that are low cost, adaptable to volume manufacture and which simplifies the microbump formation process.

It is a still further object of the present invention to provide an improved microbump interconnect useful for making a temporary or permanent electrical connection to a bare semiconductor die.

Other objects, advantages and capabilities of the present invention will become more apparent as the description proceeds.

SUMMARY OF THE INVENTION

In accordance with the present invention, an improved method for forming a microbump interconnect for bare semiconductor dice and an improved microbump interconnect are provided. The interconnect can be used to make a temporary or permanent electrical connection to a bare die.

The interconnect includes an insulating film attached to a rigid substrate. A pattern of metal conductors are formed on the insulating film, and a pattern of microbumps are formed in vias through the insulating film in electrical communication with the pattern of conductors. The microbumps correspond to a pattern of contact locations (e.g., bond pads) on the die and are adapted to make an electrical connection to the contact locations on the die.

In an illustrative embodiment, the film and conductors can are formed separately from the substrate as a two layer coupon that is attached to the substrate using a compliant adhesive layer. For forming the coupon, the pattern of conductors can be a metal layer that is electroplated on the insulating film in a desired pattern or laminated to the insulating film and then etched. The metal layer also includes one or more conductive bus bars formed in electrical communication with the pattern of conductors. Metal connecting segments are formed in the metal layer between the conductors and the conductive bus bars.

The conductive bus bars are used during formation of the coupon to provide a common electrical path for electroplating a metal into the vias to fill the vias and form the and microbumps. However, once the coupon has been attached to the rigid substrate, the connecting segments between the bus bars and conductors are severed by cutting, scribing or laser ablating the connecting segments.

An exemplary severing process is performed after attachment of the coupon to the substrate and includes forming grooves in the substrate to sever the electrical connections between the bus bars and the conductors. Separate electrical paths can then be formed to each of the conductors by wire bonding to the conductors and to corresponding bond sites on the test apparatus. If desired, the bus bars can remain intact to interconnect some of the conductors to a common electrical potential (e.g., Vss, Vcc). In general, the bus bars simplify the electroplating process and allow the microbumps to be formed with an increased density.

The method of the invention includes the steps of: forming an insulating film; forming a pattern of conductors and a conductive bus bar on the insulating film with connecting segments connecting the bus bar and conductors; forming a pattern of vias through the insulating film to the conductors; electroplating a metal into the vias and microbumps on the metal using the bus bar to provide an electrical path; attaching the insulating film to a rigid substrate; severing the connecting segments between the bus bar and conductors; and then forming separate electrical paths to the conductors for testing or other purposes.

DETAILED DESCRIPTION OF THE PREFERRED EMBODIMENT

Figure 1:
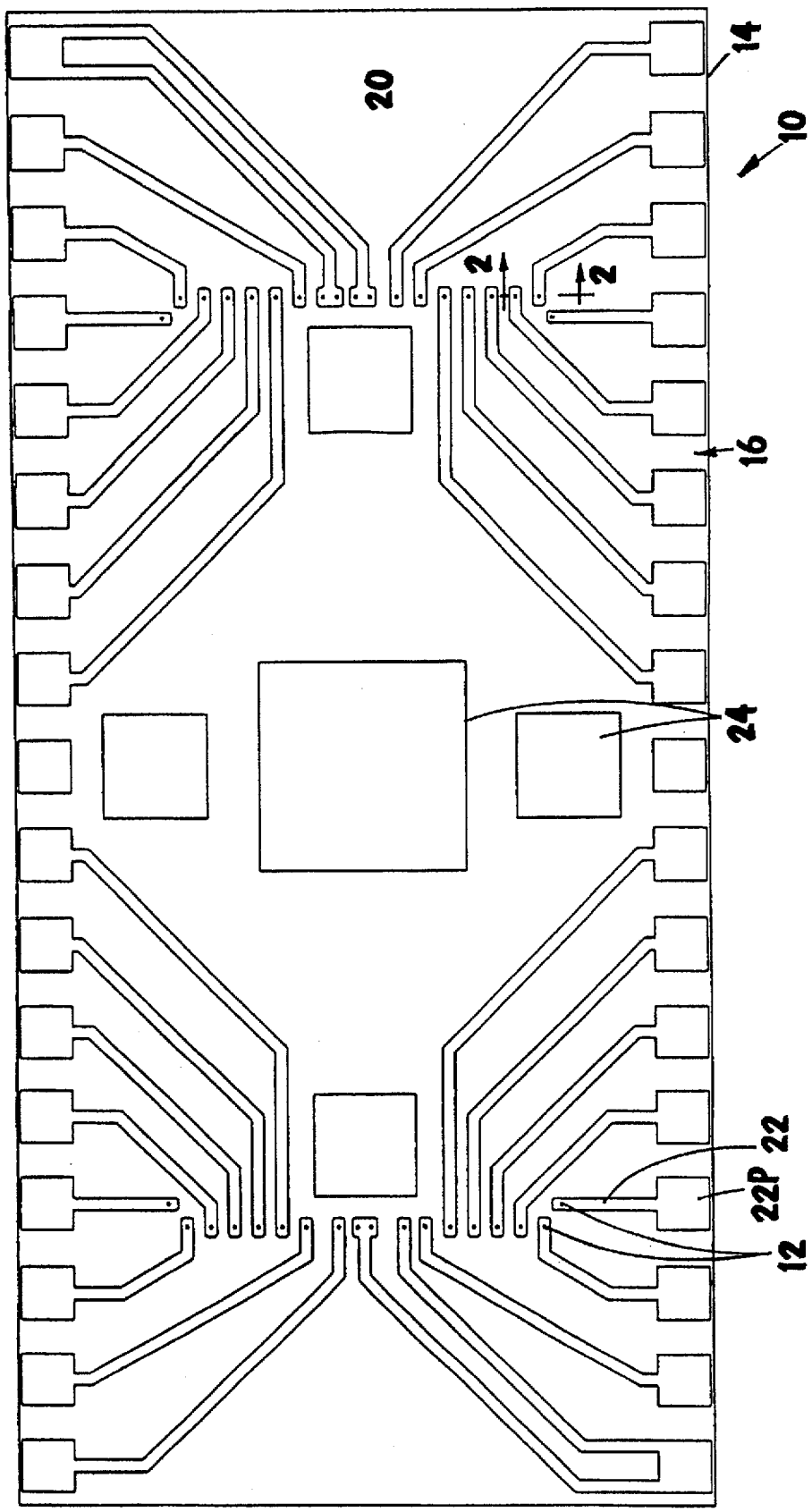
FIG. 1 is a schematic plan view of a microbump interconnect constructed in accordance with the invention.
Figure 2:
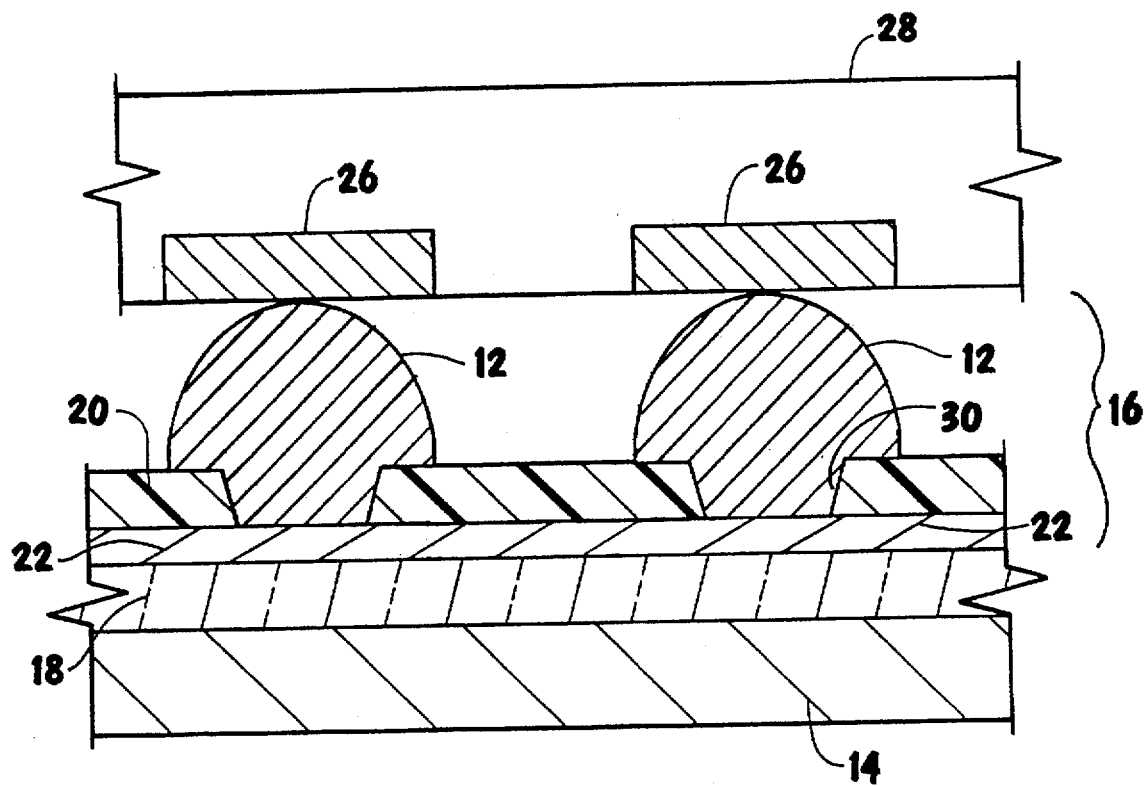
FIG. 2 is an enlarged schematic cross sectional view taken along section line 2—2 of FIG. 1 showing the interconnect in use during testing of a semiconductor die superimposed thereon.

Referring to FIGS. 1 and 2, an interconnect 10 constructed in accordance with the invention is shown. The interconnect 10 includes a rigid substrate 14 (FIG. 2) and a coupon 16 (FIG. 2) attached to the rigid substrate 14 using a compliant layer 18 (FIG. 2). The coupon 16 is formed separately from the substrate 14 and includes an insulating film 20 (FIG. 2) having a pattern of conductors 22 formed thereon. The insulating film 20 also includes a pattern of vias 30 (FIG. 2) on which microbumps 12 are formed in electrical communication with the conductors 22.

The rigid substrate 14 of the interconnect 10 has a size and peripheral outline that corresponds to the size and peripheral outline of a semiconductor die 28 (FIG. 2). The substrate 14 is preferably formed of a material that has a coefficient of thermal expansion (CTE) that approximates the CTE of a silicon die. Preferred materials for the substrate 14 include silicon, silicon-on-sapphire, silicon-on-glass, germanium and ceramic. Glass filled plastics (e.g., FR-4) and metals can also be used to form the substrate 14. The substrate 14 is preferably provided as a wafer of material formed separately from the coupon 16 and then singulated with multiple like coupons 16 attached thereto to construct multiple interconnects 10.

The coupon 16 is similar in construction to two layer TAB tape used in tape automated bonding of semiconductor dice. The insulating film 20 of the coupon 16 is formed of a non conductive and electrically insulating material such as a resin of polyimide, polyester, epoxy, urethane, polystyrene, silicone or polycarbonate.

The conductors 22 of the coupon 16 are formed of a highly conductive metal such as aluminum, copper or nickel. The conductors 22 can be formed of a metal layer that is formed on the insulating film 20 and then patterned. For example, the conductors 22 can be electroplated to the insulating film 20 through a mask. The conductors 22 can also be a metal layer laminated to the insulating film 20 by molding or other process, and then wet or dry etched to form the conductors 22. The conductors 22 can also be a thin film formed on the insulating film 20 using a metallization process (e.g., CVD, photopatterning, etching).

The conductors 22 terminate in conductor pads 22P (FIG. 1) that can be wire bonded or otherwise electrically connected to mating bonding sites (not shown) on a testing apparatus wherein the interconnect 10 will be mounted. In addition, the coupon 16 can include alignment fiducials 24 (FIG. 1) formed as etched openings in the insulating film 20 or alternately as a deposited material (e.g., screen printing). The alignment fiducials 24 can be used to align the microbumps 12 with the contact locations 26 (FIG. 2) on the die 28 (FIG. 2).

As shown in FIG. 2, the microbumps 12 are adapted to contact and establish electrical communication with contact locations 26 (e.g., bondpads) on the die 28 (FIG. 2) held in a testing apparatus (not shown). The microbumps 12 can also be used to provide a permanent electrical connection to the die 28. The microbumps 12 can be formed with a hemispherical or convex shape as shown or in a different shape (e.g., conical, pyramidal, flat top mesa).

The microbumps 12 are formed in alignment with the vias 30 through the insulating film 20. The vias 30 are filled with metal and thus provide a conductive path between the conductors 22 and the microbumps 12. As will be more fully explained, the microbumps 12 can be formed of one or more layers of a conductive metal using an electrodeposition process.

Suitable metals for forming the microbumps 12 include Ni, Au, Cu, Pd. For applications that require permanent bonding of the microbumps 12 to the contact locations 26 (FIG. 2), a solder alloy (e.g., Pb—Sn) can be used to form the microbumps.

The microbumps 12 can be formed with a diameter of between about 8 µm to 50 µm. The vias 30 can be smaller in diameter than the microbumps 12 and can be filled with a same metal as the microbumps 12 or a different metal than the microbumps 12. For example, the vias 30 can be filled with a metal such as copper or nickel and the microbumps 12 formed of a metal as identified above.

The compliant layer 18 for the interconnect 10 is formed of an elastomeric adhesive material such as an epoxy or silicone elastomer. The compliant layer 18 functions to attach the coupon 16 to the substrate 14. In addition, the compliant layer 18 allows the microbumps 12 to move in a z-direction under loading in the test apparatus to accommodate dimensional variations between the contact locations 26 on the semiconductor die 28 and variations between the microbumps 12. The compliant layer 18 is therefore formed of a material that will retain its resiliency with continued usage. One suitable adhesive is Zymet™ silicone elastomer manufactured by Zymet, Inc., East Hanover N.J. The thickness of the compliant layer 18 can be from several microns to several mills or more.

Figure 3A:
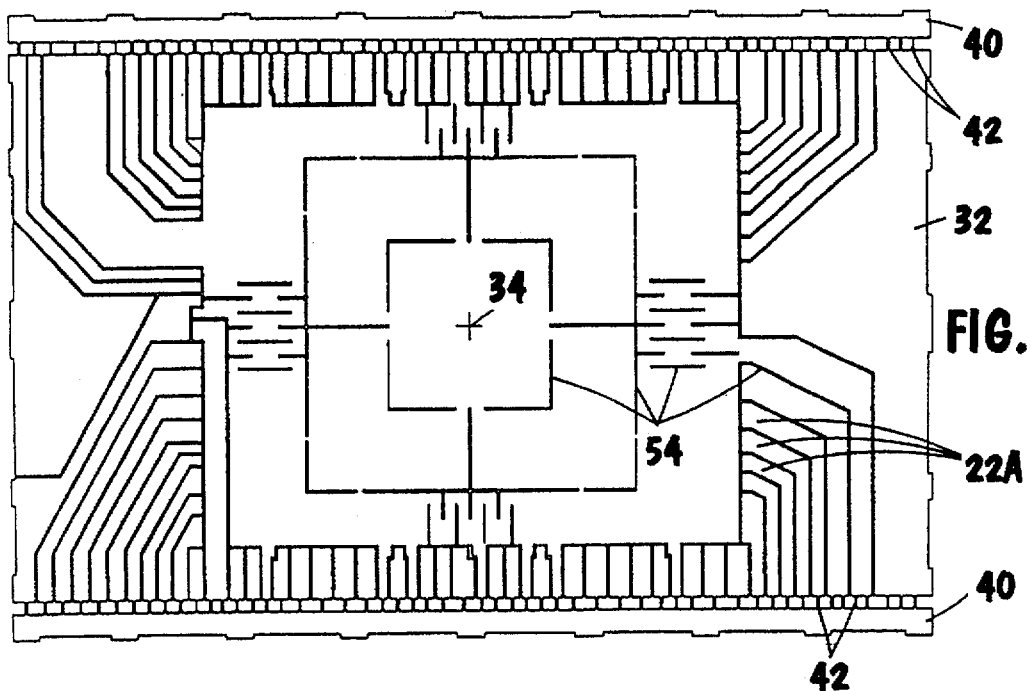
FIG. 3A is a plan view of a metal layer for the interconnect having a pattern of conductors and bus bars formed thereon.
Figure 3B:
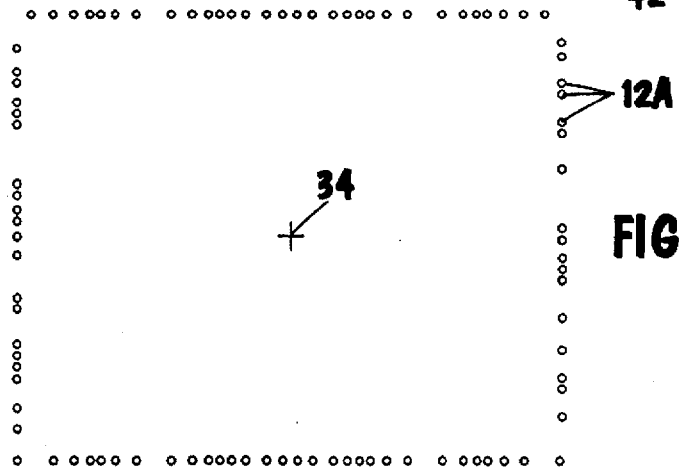
FIG. 3B is a plan view of a pattern of microbumps for the interconnect that are formed in electrical communication with the conductors during an electroplating step using the bus bars.
Figure 3C:
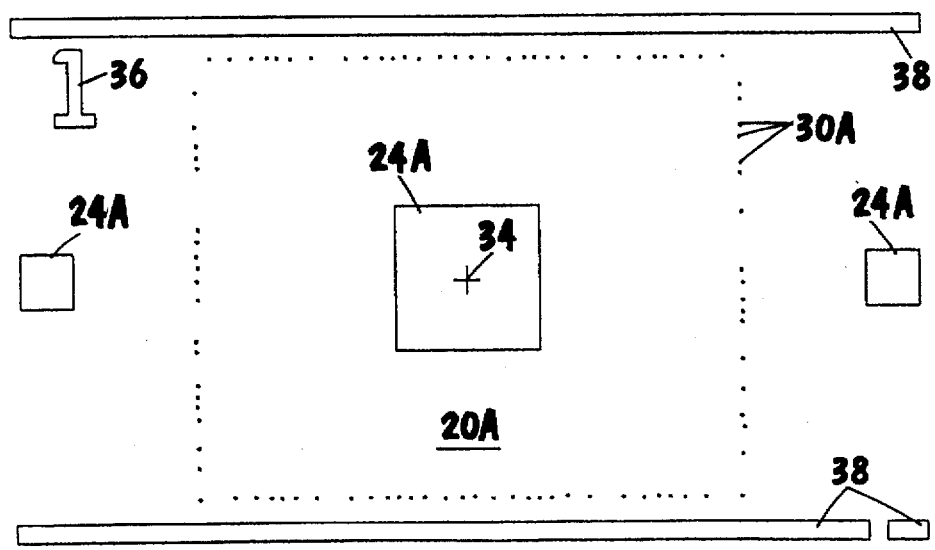
FIG. 3C is a plan view of the insulating film for the interconnect showing a pattern of vias and other features formed thereon.

Referring to FIGS. 3A–C, 4 and 5, a method for forming an interconnect 10A (FIG. 5) in accordance with the invention is shown. FIGS. 3A–3C illustrate the different elements of the coupon 16A (FIG. 5) for the interconnect 10A. The interconnect 10A and coupon 16A are substantially similar to the interconnect 10 and coupon previously described.

In FIG. 3A, a metal layer 32 comprising pattern of conductors 22A for the coupon 16A is shown. In FIG. 3B, the pattern of microbumps 12A for the conductors 22A is shown. In FIG. 3C, the pattern of vias 30A in the insulating layer 20A of the coupon 16A is shown.

An exemplary fabrication sequence for the coupon 16A includes forming the insulating film 20A (FIG. 3C). The insulating film 20A can be formed as a length of tape (e.g., Kapton™ tape sold by DuPont) or as a segment of a molded material. A representative thickness for the insulating film 20A can be from 1 to 25 µm. The metal layer 32 (FIG. 3A)

is formed on the insulating film 20A (FIG. 3C) using a suitable process. One process for forming the metal layer 32 comprises electroplating through a mask (not shown) onto the insulating film 20A in the desired pattern. Another process comprises laminating a metal foil to the insulating film 20A and then wet or dry etching the foil into the desired pattern. The insulating film 20A can also be molded in place on the metal layer 32 followed by patterning of the metal layer 32 or molded to a pre-patterned metal layer 32.

Figure 5:
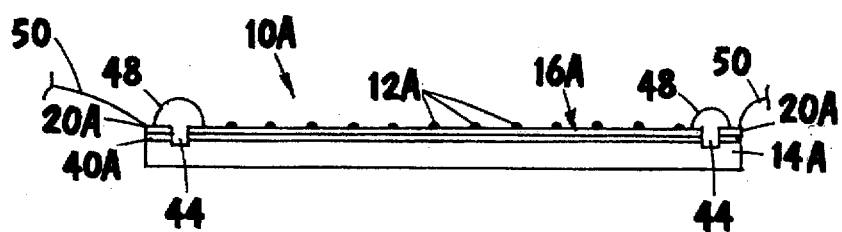
FIG. 5 is a schematic side elevation view taken along line 5—5 of FIG. 4 showing grooves formed in the substrate for severing the electrical path between the conductors and bus bars.

As shown in FIG. 3A, the metal layer 32 is formed on a center line 34 for the interconnect 10A (FIG. 5). By way of example, the metal layer 32 can be formed with a thickness of from 15–35 µm. In FIG. 3A, various pattern lines 54 indicate areas of the metal pattern where there is no material. The metal layer 32 includes the pattern of conductors 22A that function substantially as previously described. In addition, the metal layer 32 includes a pair of bus bars 40 and a pattern of connecting segments 42 that connect the bus bars 40 and the conductors 22A. The bus bars 40 and connecting segments 42 will be used during an electroplating process to fill the vias 30A (FIG. 3C) and form the microbumps 12A (FIG. 3B).

As shown in FIG. 3B, the microbumps 12A are formed in a pattern on the center line 34 of the interconnect 10A. This pattern aligns with the inner end portions of the conductors 22A (FIG. 3A). The pattern of the microbumps 12A is dictated by the location of the contact locations 26 (FIG. 2) on the die 28 (FIG. 2). The pattern of the microbumps 12A is a mirror image of the pattern of contact locations 26 (FIG. 2) on the die 28. This pattern can be according to standard designs for semiconductor dice (e.g., edge connect, end connect, lead-on-chip).

A representative diameter for the microbumps 12A can be from 15–100 µm. A spacing for the microbumps 12A will depend on the spacing of the contact locations 26 (FIG. 2) but will be on the order of 25–250 µm or greater. The microbumps 12A have a diameter that is substantially larger than the diameter of the vias 30A (FIG. 3C). Accordingly, the microbumps 12A can be supported in part by the insulating film 20A.

Referring to FIG. 3C, the insulating film 20A includes the pattern of vias 30A that aligns with the microbumps 12A (FIG. 3B). The vias 30A can be formed in the insulating film 20A by etching, laser ablation or machining. For example, with the insulating film 20A formed of polyimide, the vias 30A can be etched through a mask (not shown) using a solution of TMAH (tetramethylammonium hydroxide). Alternately, an excimer laser having a laser fluence in the range of 250–350 mJ can be used to ablate the insulating film 20A to form the vias 30A.

The insulating film 20A can also include rectangular openings 38 that align with bonding sites on the conductors 22A (FIG. 3A) where a wire bond will subsequently be formed. The insulating film 20A can also include alignment fiducials 24 that function as previously explained. In addition, an indicator 36 such as a pin orientation legend can be formed on the insulating film 20A to aid in properly positioning the interconnect 10A in the testing apparatus. The alignment fiducials 24 and indicator 36 can be formed of a deposited material or can be formed as openings etched into the insulating film 20A.

The electroplating process for forming the microbumps 12A can be performed with the metal layer 32 and insulating film 20A assembled together and with the assembled part submerged in a plating solution. With the metal layer submerged in the plating solution, current is applied to the bus bars 40. A conductive path for the plating current is provided by the bus bars 40 and by the connecting segments 42 and conductors 22A. During the electroplating process, the vias 30A (FIG. 3C) in the insulating film 20A provide a mask pattern for initially filling the vias 30A with metal and then forming the microbumps 12A on the metal filled vias. The exterior portions of the metal layer 32 that are exposed to the plating solution can be masked off with tape or other material to prevent the plating metal from forming on these surfaces.

The electroplating process can also be controlled to electroplate a first metal which fills the vias 30A and a second metal which forms the microbumps 12A on the metal filled vias 30A. Following formation of the microbumps 12A, the electroplating process can be controlled to form a passivation layer on the microbumps. For example, the passivation layer can be an inert metal layer (e.g., gold) that overcoats the microbumps 12A. For plating the different metals suitable plating solutions and currents can be used as required.

In some applications a separate mask (not shown) can be formed on the insulating film 20A to form the microbumps 12A in a particular shape and size. Furthermore, in some applications it can be beneficial to electroplate the vias 30A with a first metal and then use a separate deposition process such as screen printing or evaporation through a mask to form the microbumps 12A. Additionally, a thermal reflow process can subsequently be employed to heat and further shape the microbumps 12A as required.

Figure 4:
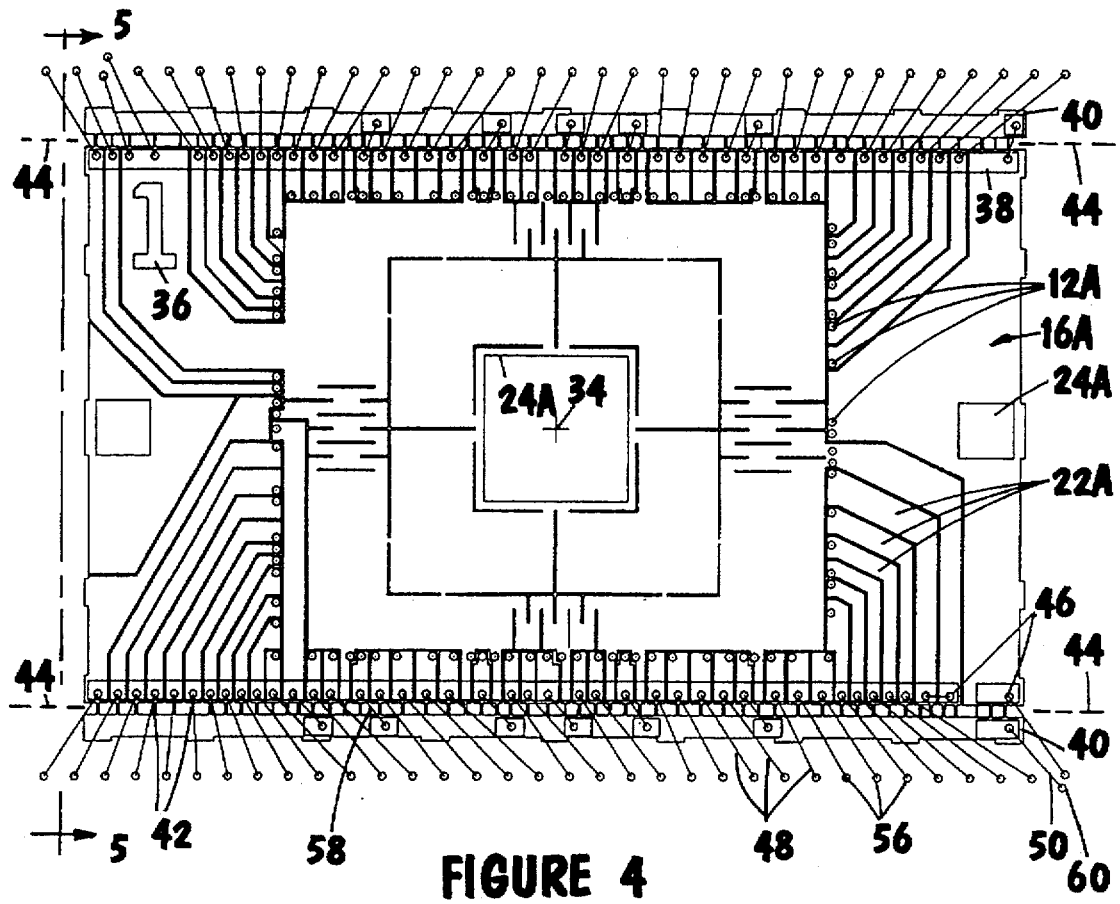
FIG. 4 is a plan view of an interconnect constructed in accordance with the invention shown wire bonded to a test apparatus.

Referring to FIGS. 4 and 5, following formation of the microbumps 12A, the coupon 16A is attached to the rigid substrate 14A (FIG. 5) using a compliant layer 18 (FIG. 2) formed of an elastomeric adhesive as previously described. Preferably, multiple coupons 16A are formed and attached to the substrate 14A which is formed on a wafer. The wafer is then singulated into individual interconnects 10A. U.S. patent application Ser. No. 08/563,509 now U.S. Pat. No. 5,678,301, incorporated herein by reference, describes a method for attaching multiple coupons 16A to multiple substrates 14A formed on a wafer.

During the electroplating process for forming the microbumps 12A, the bus bars 40 function as conductive members to provide a conductive path for electroplating. However, following the electroplating process, the connecting segments 42 (FIG. 5) which connect the bus bars 40 to the conductors 22A are severed. This permits the conductors 22A to be subsequently separately electrically connected to a test apparatus using bond wires or other electrical members. Furthermore, the bus bars 40 can remain to provide a common conductive path (e.g., Vss, Vcc) to some of the conductors 22A. Still further, some of the connecting segments 42 can be left intact to provide a common conductive path to some of the conductors 22A.

The connecting segments 42 can be severed by saw cutting, scribing, laser ablation or other suitable method. One method includes forming grooves 44 (FIG. 5) in the substrate 14A is by saw cutting. The grooves 44 can be formed after attachment of the coupon 16A to the substrate 14A. The grooves 44 sever the connecting segments 42 and extend into the substrate 14A to a depth of several mils or more. A width of the grooves 44 can be as required.

Following formation of the grooves 44, separate electrical paths are provided to the conductors 22A by wire bonding. Bond wires 48 can be wire bonded to bonding sites 46 on the conductors 22A and to corresponding bonding sites 56 on the testing apparatus. In addition, the bus bars 40 can be left intact and electrically connected using bond wires 50 to bonding sites 60 formed on the testing apparatus. Other bond wires 58 can electrically connect the bus bars 40 to select conductors 22A. The bus bars 40 thus function to electrically connect some of the conductors 22A to a common potential. For example, one of the bus bars 40 can be electrically connected to Vss and one of the bus bars 40 can be electrically connected to Vcc. The conductors 22A that require a connection to these potentials can thus be wire bonded to the bus bars 40.

Alternately in place of wire bonding, separate electrical paths to the conductors 22A can be established by other means. For example, slide connectors formed on the testing apparatus can be used to form separate conductive paths to the conductors 22A.

The interconnect 10A formed in accordance with the method of the invention permits a temporary electrical connection to be made to bare dice for testing. Alternately, the interconnect 10A can be used to form a permanent electrical connection to bare dice such as in the formation of multi chip modules and other electronic devices. The method provides an improved interconnect 10A because the geometry of the conductors 22A and microbumps 12A can be made tighter due to the use of the bus bars 40 during electroplating. Furthermore, the bus bars 40 simplify the electroplating process because separate electrical paths to each conductor 22A do not need to be formed.

Although the method of the invention has been described with reference to certain preferred embodiments, as will be apparent to those skilled in the art, certain changes and modifications can be made without departing from the scope of the invention as defined by the following claims.

What is claimed is:

1. A method for forming an interconnect for a semiconductor die, comprising:
    forming a conductor on an insulating film;
    forming a conductive member on the insulating film in electrical communication with the conductor;
    electroplating a metal onto the conductor using the conductive member to provide an electrical path; and
    severing the electrical communication between the conductive member and conductor.

2. The method as claimed in claim 1 and wherein the metal is a microbump.

3. The method as claimed in claim 2 and further comprising attaching the insulating film to a substrate.

4. The method as claimed in claim 3 and wherein severing the electrical communication is by forming a groove in the substrate to sever the electrical path.

5. A method for forming an interconnect for a semiconductor die, comprising:
    forming an insulating film;
    forming a conductor and a conductive bus bar on the insulating film with a connecting segment connecting the bus bar and conductor;
    electroplating a microbump in electrical communication with the conductor using the bus bar to provide an electrical path;
    severing the connecting segment between the bus bar and conductor; and
    forming an electrical path to the conductor.

6. The method as claimed in claim 5 and further comprising attaching the insulating film to a substrate.

7. The method as claimed in claim 6 and wherein attaching the insulating film to the substrate is with an elastomeric adhesive.

8. The method as claimed in claim 7 and wherein the severing the connecting segment is by forming a groove in the substrate.

9. The method as claimed in claim 8 and wherein a plurality of conductors and connecting segments are formed.

10. The method as claimed in claim 9 and wherein a plurality of microbumps are formed in a pattern corresponding to contact locations on the die.

11. The method as claimed in claim 10 and wherein the microbumps are formed in alignment with vias in the insulating film.

12. The method as claimed in claim 11 and further comprising testing the die using the interconnect to establish a temporary electrical connection with contact locations on the die.

13. The method as claimed in claim 12 and further comprising using a die testing apparatus for retaining the die and interconnect during the testing.

14. A method for forming an interconnect for a semiconductor die, comprising:
    forming an insulating film;
    forming a pattern of conductors and a conductive member on the insulating film with connecting segments connecting the conductors and conductive member;
    forming a pattern of vias through the insulating film to the conductors;
    electroplating a metal into the vias using the conductive member to provide a conductive path; and
    severing the connecting segments between the conductive member and conductors.

15. The method as claimed in claim 14 and further comprising electroplating microbumps on the metal in the vias using the conductive member.

16. The method as claimed in claim 14 and wherein severing the connecting segments between the conductive member and conductors is with a method selected from the group consisting of sawing, scribing and laser ablation.

17. The method as claimed in claim 14 and further comprising following the severing step forming separate electrical paths to the conductors.

18. The method as claimed in claim 14 and further comprising attaching the insulating film to a rigid substrate.

19. The method as claimed in claim 18 and wherein the severing step is by forming a groove in the substrate.

20. The method as claimed in claim 18 and wherein attaching the insulating film to the substrate is with a compliant adhesive layer.

21. The method as claimed in claim 14 and further comprising forming at least one connecting segment between the conductors and conductive member that is not severed during the severing step.

22. The method as claimed in claim 14 and wherein the insulating film is formed of a material selected from the group consisting of polyimide, polyester, epoxy, urethane, polystyrene, silicone and polycarbonate.

23. The method as claimed in claim 14 and wherein the metal is selected from the group consisting of Ni, Au, Cu, Pd and solder.

24. A method for forming an interconnect for a semiconductor die, comprising:
    forming an insulating film;
    forming a pattern of conductors and a conductive bus bar on the insulating film with connecting segments connecting the bus bar and conductors;
    forming a pattern of vias through the insulating film to the conductors;

electroplating a metal into the vias and microbumps on the metal using the bus bar;

attaching the insulating film to a substrate;

severing the connecting segments between the bus bar and conductors; and forming separate electrical paths to the conductors.

25. The method as claimed in claim 24 and wherein severing the connecting segments is by forming a groove in the substrate.

26. The method as claimed in claim 24 and wherein attaching the insulating film to the substrate is with an elastomeric adhesive.

27. The method as claimed in claim 24 and wherein the microbumps and metal are different materials.

28. The method as claimed in claim 24 and wherein the microbumps and metal are a same material.

29. The method as claimed in claim 24 and wherein the microbump is formed of a material selected from the group consisting of Ni, Au, Cu, Pd and solder.

30. The method as claimed in claim 24 and further comprising testing the die using the interconnect.

31. The method as claimed in claim 24 and further comprising forming a connecting segment between the conductors and bus bar that is not severed during the severing step.

32. The method as claimed in claim 24 and wherein the substrate is formed of a material selected from the group consisting of silicon, silicon-on-glass, silicon-on-sapphire and ceramic.

33. The method as claimed in claim 24 and wherein the insulating film is formed of a material selected from the group consisting of resin of polyimide, polyester, epoxy, urethane, polystyrene, silicone and polycarbonate.

34. The method as claimed in claim 24 and wherein the microbumps are formed in a pattern corresponding to contact locations on the die.

35. The method as claimed in claim 24 and wherein a pair of bus bars are formed.

36. The method as claimed in claim 24 and wherein the separate electrical paths include a path through the bus bar to a common electrical potential.

* * * * *